US011334462B2

(12) United States Patent
Lee

(10) Patent No.: US 11,334,462 B2
(45) Date of Patent: May 17, 2022

(54) MEMORY SYSTEM AND OPERATING METHOD THEREOF

(71) Applicant: SK hynix Inc., Gyeonggi-do (KR)

(72) Inventor: Jong-Hwan Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 194 days.

(21) Appl. No.: 16/723,075

(22) Filed: Dec. 20, 2019

(65) Prior Publication Data

US 2020/0250061 A1 Aug. 6, 2020

(30) Foreign Application Priority Data

Feb. 1, 2019 (KR) .......................... 10-2019-0013867

(51) Int. Cl.
*G06F 11/00* (2006.01)
*G06F 11/30* (2006.01)
*G11C 11/4074* (2006.01)
*G06F 11/07* (2006.01)
*G06F 1/14* (2006.01)
*G06F 11/10* (2006.01)

(52) U.S. Cl.
CPC ............ *G06F 11/3058* (2013.01); *G06F 1/14* (2013.01); *G06F 11/076* (2013.01); *G06F 11/1044* (2013.01); *G06F 11/3037* (2013.01); *G11C 11/4074* (2013.01)

(58) Field of Classification Search
CPC ............. G06F 11/3058; G06F 11/3037; G06F 11/076; G06F 11/1402; G11C 16/26
See application file for complete search history.

(56) References Cited

U.S. PATENT DOCUMENTS

| 2018/0189135 | A1* | 7/2018 | Naik | G11C 16/26 |
| 2019/0267054 | A1* | 8/2019 | Thalaimalaivanaraj | |
| | | | | G11C 29/42 |
| 2019/0371402 | A1* | 12/2019 | Lin | G11C 5/063 |
| 2021/0118518 | A1* | 4/2021 | Wu | G11C 29/021 |
| 2021/0174886 | A1* | 6/2021 | Prakash | G11C 16/26 |

FOREIGN PATENT DOCUMENTS

| KR | 10-2016-0090074 | 7/2016 |
| KR | 10-2016-0124990 | 10/2016 |
| KR | 10-2018-0070974 | 6/2018 |

* cited by examiner

*Primary Examiner* — Amine Riad
(74) *Attorney, Agent, or Firm* — IP & T Group LLP

(57) ABSTRACT

A memory system may include a memory device including a plurality of memory cells, and a controller suitable for controlling the memory device to perform a first read operation by applying a first read voltage to a target memory cell in which data corresponding to a read command provided from a host is stored. When the number of fail bits in first read data read through the first read operation is greater than or equal to a preset threshold value, the controller may check outside temperature recorded in a temperature table based on real time clock (RTC) information and country information which are provided from the host, set a second read voltage based on the outside temperature and a read voltage table, and control the memory device to perform a second read operation by applying the second read voltage to the target memory cell.

20 Claims, 12 Drawing Sheets

FIG. 4A-A
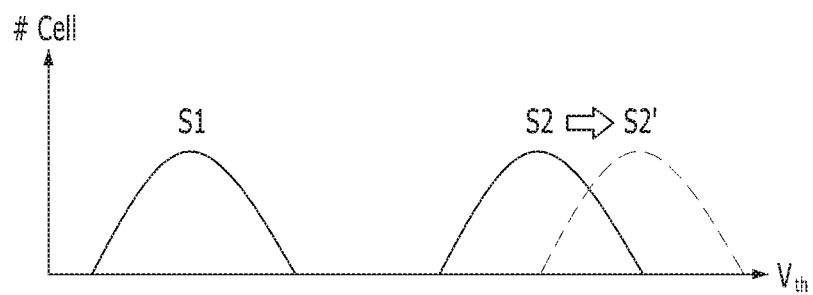
FIG. 4A-B
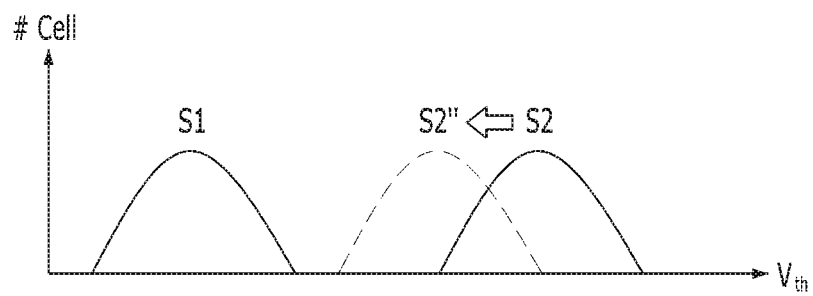

FIG. 4B-A
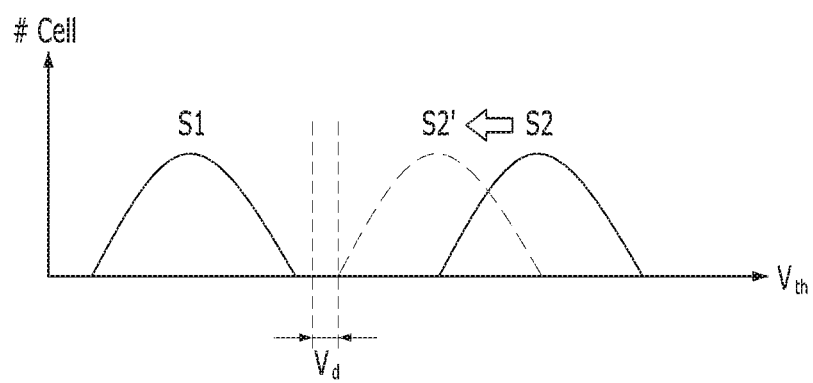
FIG. 4B-B
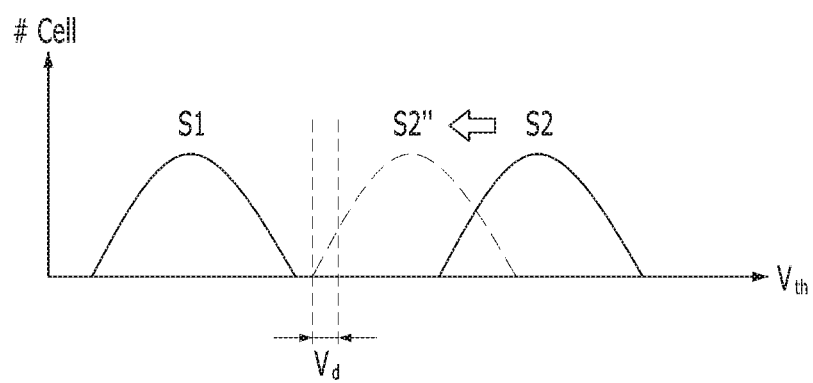

FIG. 4C-A
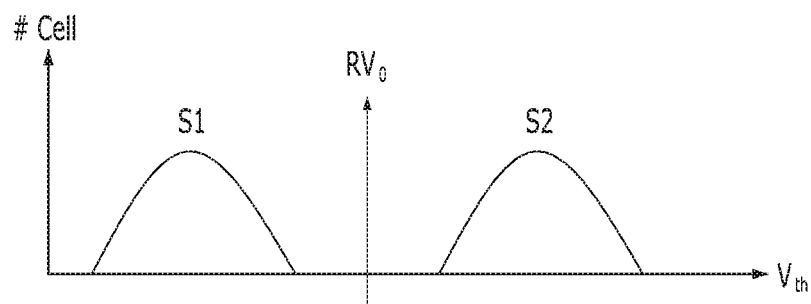
FIG. 4C-B
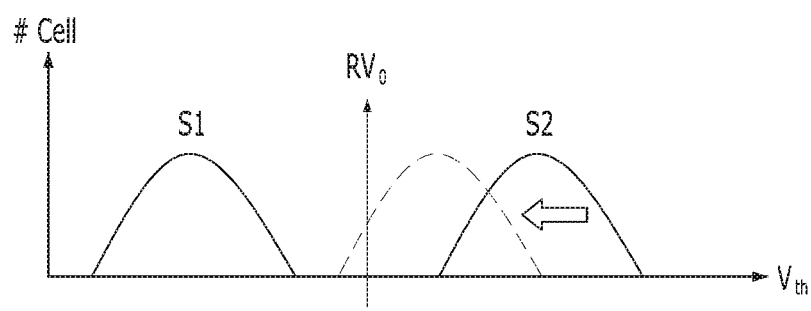

| | First Country | Second Country | Third Country | | K<sup>th</sup> Country |
|---|---|---|---|---|---|
| January | -3 | 23 | 29 | | |
| February | -0.5 | 23 | 25 | | |
| March | 5 | 24 | 25 | | |
| April | 12 | 24 | 20 | | |
| May | 17 | 25 | 15 | | |
| June | 21 | 25 | +10 | ... | |
| July | 24 | 26 | 10 | | |
| August | 25 | 26 | 8 | | |
| September | 20 | 26 | 15 | | |
| October | 14 | 27 | 16 | | |
| November | 7 | 25 | 20 | | |
| December | 0.5 | 24 | 21 | | |

| Temperature | Index | RV1 | RV2 | RV3 |
|---|---|---|---|---|
| -10° ≤ T < 0° | 1 | RV11 | RV21 | RV31 |
| | 2 | RV12 | RV22 | RV32 |
| | 3 | RV13 | RV23 | RV33 |
| | ⋮ | | | |
| | N | RV1n | RV2n | RV3n |
| ⋮ | | | | |
| 10° ≤ T < 20° | 1 | RV11' | RV21' | RV31' |
| | 2 | RV12' | RV22' | RV32' |
| | 3 | RV13' | RV23' | RV33' |
| | ⋮ | | | |
| | N | RV1n' | RV2n' | RV3n' |
| 20° ≤ T < 30° | 1 | RV11" | RV21" | RV31" |
| | 2 | RV12" | RV22" | RV32" |
| | 3 | RV13" | RV23" | RV33" |
| | ⋮ | | | |
| | N | RV1n" | RV2n" | RV3n" |

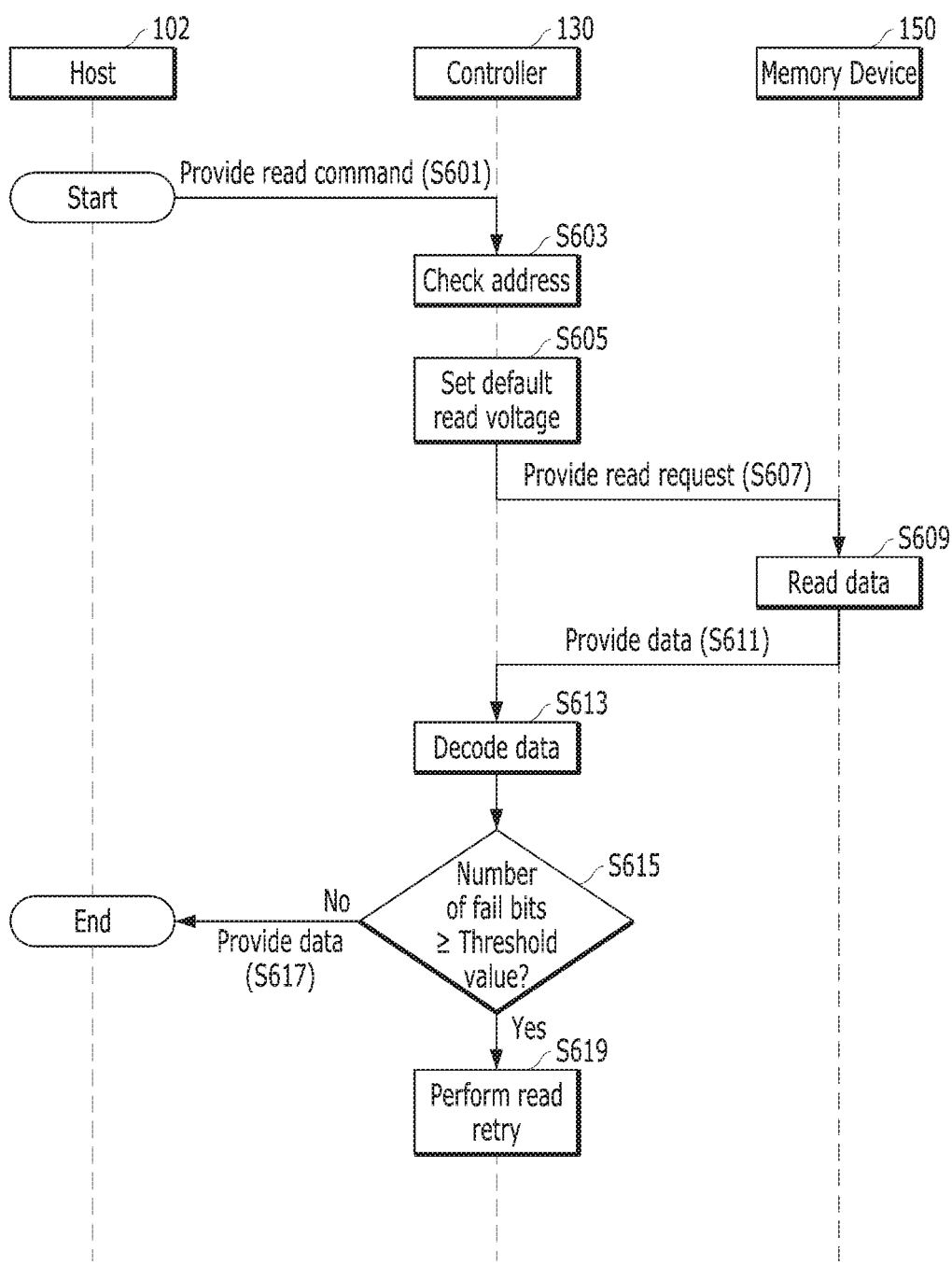

MEMORY SYSTEM AND OPERATING METHOD THEREOF

CROSS-REFERENCE TO RELATED APPLICATION

This application claims priority under 35 U.S.C. § 119 to Korean Patent Application No. 10-2019-0013867 filed on Feb. 1, 2019, which is incorporated herein by reference in its entirety.

BACKGROUND

1. Field

Exemplary embodiments relate to a memory system and an operating method thereof, and more particularly, to a memory system capable of improving data processing efficiency, and an operating method thereof.

2. Discussion of the Related Art

The computer environment paradigm has been transitioning to ubiquitous computing, which enables computing systems to be used virtually anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since memory systems have no moving parts, memory systems provide advantages such as excellent stability and durability, high information access speed, and low power consumption. Examples of memory systems having such advantages include universal serial bus (USB) memory devices, memory cards having various interfaces, and solid state drives (SSD).

SUMMARY

Various embodiments are directed to a memory system capable of efficiently processing data depending on temperature.

In an embodiment, a memory system may include: a memory device including a plurality of memory cells; and a controller suitable for controlling the memory device to perform a first read operation by applying a first read voltage to a target memory cell in which data corresponding to a read command provided from a host is stored. When the number of fail bits in first read data read through the first read operation is greater than or equal to a set threshold value, the controller may check outside temperature recorded in a temperature table based on real time clock (RTC) information and country information which are provided from the host, set a second read voltage based on the outside temperature and a read voltage table, and control the memory device to perform a second read operation by applying the second read voltage to the target memory cell.

In an embodiment, an operating method of a memory system, the operating method may include: receiving real time clock (RTC) information and country information from a host; performing a first read operation by applying a first read voltage to a target memory cell in which data corresponding to a read command provided from the host is stored; checking outside temperature recorded in a temperature table based on the RTC information and the country information, when the number of fail bits in first read data read through the first read operation is greater than or equal to a set threshold value; setting a second read voltage based on the outside temperature and a read voltage table; and performing a second read operation by applying the second read voltage to the target memory cell.

In an embodiment, a memory system comprising: a memory device including memory cells; and a controller configured to: store therein a temperature table and a read-retry voltage table; obtain temperature information of a current temperature at a current geographical location based on the temperature table and information of a real time clock (RTC) and a current geographical location provided from a host; control the memory device to perform a read-retry operation on one or more of the memory cells according to a group of read voltages selected on a basis of the temperature information and the read-retry voltage table, wherein the temperature table has information of monthly average temperatures at specific geographical locations, and wherein the read-retry voltage table has information of plural groups of read voltages for each of predetermined temperature ranges.

BRIEF DESCRIPTION OF THE DRAWINGS

FIGS. 4A-A to 4B-B are graphs for describing states of memory cells, which are shifted by degradation in characteristics of the memory cells.

FIGS. 4C-A and 4C-B illustrates a change in the read voltage applied to the memory device by reflecting the shifted threshold voltage distribution.

FIG. 5A illustrates a temperature table in accordance with an embodiment.

FIG. 5B illustrates a read voltage table in accordance with an embodiment.

FIG. 6 is a flowchart illustrating a read operation in accordance with an embodiment.

DETAILED DESCRIPTION

Hereafter, exemplary embodiments of the present invention will be described with reference to the accompanying drawings. It should be understood that the following descriptions will be focused on portions required for understanding an operation in accordance with an embodiment, and descriptions of the other portions will be omitted in order not to unnecessarily obscure subject matters of the present disclosure.

Hereafter, exemplary embodiments will be described in detail with reference to the accompanying drawings.

Figure 1:
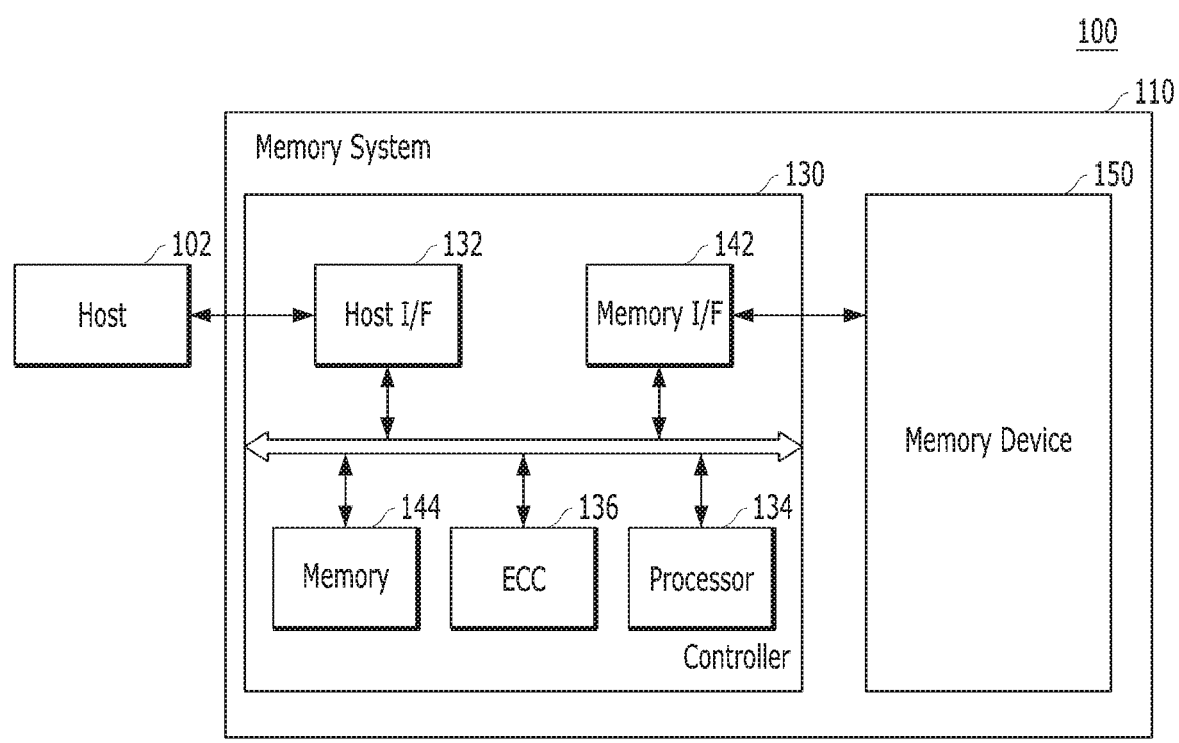
FIG. 1 is a diagram schematically illustrating an example of a data processing system including a memory system in accordance with an embodiment.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, MP3 player and laptop computer, or any of various non-portable electronic devices such as a desktop computer, a game machine, a television (TV), and a projector.

The host 102 may include at least one operating system (OS), which may manage and control overall functions and operations of the host 102, and provide operation between the host 102 and a user using the data processing system 100 or the memory system 110. The OS may support functions and operations corresponding to the use, purpose, and usage of a user. For example, the OS may be divided into a general OS and a mobile OS, depending on the mobility of the host 102.

An electronic device including a host 102 may be connected to an external communication network, and receive real time clock (RTC) information and country information from the external communication network. The host 102 may newly update existing RTC information and country information, based on the received RTC information and country information. The RTC information may include absolute time or relative time. The country information may include country and city information.

The host 102 may provide the RTC information to the memory system 110. The host 102 may provide the RTC information to the memory system 110 in each preset period. The period in which the RTC information is provided may be set by a designer. For example, the host 102 may provide the RTC information to the memory system 110 during a system booting operation. The memory system 110 may receive the RTC information from the host 102, and update the RTC information. The memory system 110 may efficiently perform an internal operation by utilizing the RTC information.

The host 102 may provide country information to the memory system 110 with the RTC information, the country information indicating where an electronic device including the host 102 is currently used.

For example, when the electronic device including the host 102 performed a system booting operation in Seoul at 16:20 on Dec. 24, 2018, the host 102 may provide the memory system 110 with the RTC information indicating '2018-12-24, 16:20' and the country information indicating 'Seoul'.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the. The SD card may include a mini-SD card and micro-SD card.

The memory system 110 may be embodied by various types of storage devices. Examples of such storage devices may include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory. The flash memory may have a 3-dimensional (3D) stack structure.

The memory system 110 may include the memory device 150 and the controller 130.

The controller 130 and the memory device 150 may be integrated into a single semiconductor device. For example, the controller 130 and the memory device 150 may be integrated as one semiconductor device to constitute a solid state drive (SSD). When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD card, micro-SD card and SDHC card, or universal flash storage (UFS) device.

The memory device 150 of the memory system 110 may retain data stored therein even though no power is supplied. In particular, the memory device 150 may store data provided from the host 102 through a write operation, and provide data stored therein to the host 102 through a read operation. The memory device 150 may include a plurality of memory blocks 152, each of the memory blocks may include a plurality of pages, and each of the pages may include a plurality of memory cells to which a plurality of word lines WL are coupled. Furthermore, the memory device 150 may include a plurality of planes each including the plurality of memory blocks. In particular, the memory device 150 may include a plurality of dies each including the plurality of planes. The memory device 150 may be implemented with a nonvolatile memory device, for example, a flash memory. At this time, the flash memory may have a three-dimensional stack structure.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, program and erase operations of the memory device 150.

The controller 130 may include a host interface (I/F) 132, a processor 134, an error correction code unit (ECC) 136, a memory I/F 142 and a memory 144. Although not illustrated in the drawing, the controller 130 may further include a power management unit (PMU) capable of providing and managing power of the components included in the controller 130.

The host I/F 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE).

The host I/F 132 may be driven through firmware referred to as a host interface layer (HIL) in order to exchange data with the host.

The memory I/F 142 may serve as a memory/storage interface for interfacing the controller 130 and the memory device 150 such that the controller 130 controls the memory device 150 in response to a request from the host 102.

The ECC unit 136 may correct error bits of data processed in the memory device 150, and include an ECC encoder and an ECC decoder.

The ECC encoder may generate data with a parity bit by performing error correction encoding on data to be programmed into the memory device 150, and the data with the parity bit may be stored in the memory device 150. The ECC decoder detects and corrects errors included in data read from the memory device 150 when reading the data stored in the memory device 150.

The ECC unit 136 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 136 is not limited to any specific structure. The ECC unit 136 may include any and all circuits, modules, systems or devices for error correction.

The processor 134 may control overall operations of the memory system 110. In particular, the processor 134 may control a program operation or read operation on the memory device 150 in response to a write request or read request from the host 102. For example, the processor 134 may control the memory device 150 to perform a read operation by applying a preset read voltage to a target memory cell in which data corresponding to a read command is stored. Furthermore, the processor 134 may control a read retry operation on the memory device 150 in response to a read retry request provided from the ECC 136. The read retry operation in accordance with the present embodiment will be described in detail with reference to FIG. 7.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a central processing unit (CPU).

Also, the controller 130 may perform a background operation onto the memory device 150 through the processor 134, which is realized as a microprocessor or a CPU. For example, the background operation performed on the memory device 150 may include a garbage collection (GC) operation, a wear-leveling (WL) operation, a map flush operation, or a bad block management operation.

The memory 144 may serve as a working memory of the memory system 110 and the controller 130, and store data for driving the memory system 110 and the controller 130.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

As described above, the memory 144 may store data required for performing a data write/read operation between the host and the memory device 150, and data when the data write/read operation is performed. In order to store such data, the memory 144 may include a program memory, data memory, write buffer/cache, read buffer/cache, data buffer/cache, map buffer/cache or the like.

The memory 144 may store a temperature table 510 and a read voltage table 530 which are utilized for a read retry operation. The temperature table 510 and the read voltage table 530 may also be stored in the memory device 150, and loaded to the memory 144 from the memory device 150 by the processor 134. The temperature table 510 and the read voltage table 530 will be described in detail with reference to FIGS. 5A and 5B, respectively.

Figure 2:
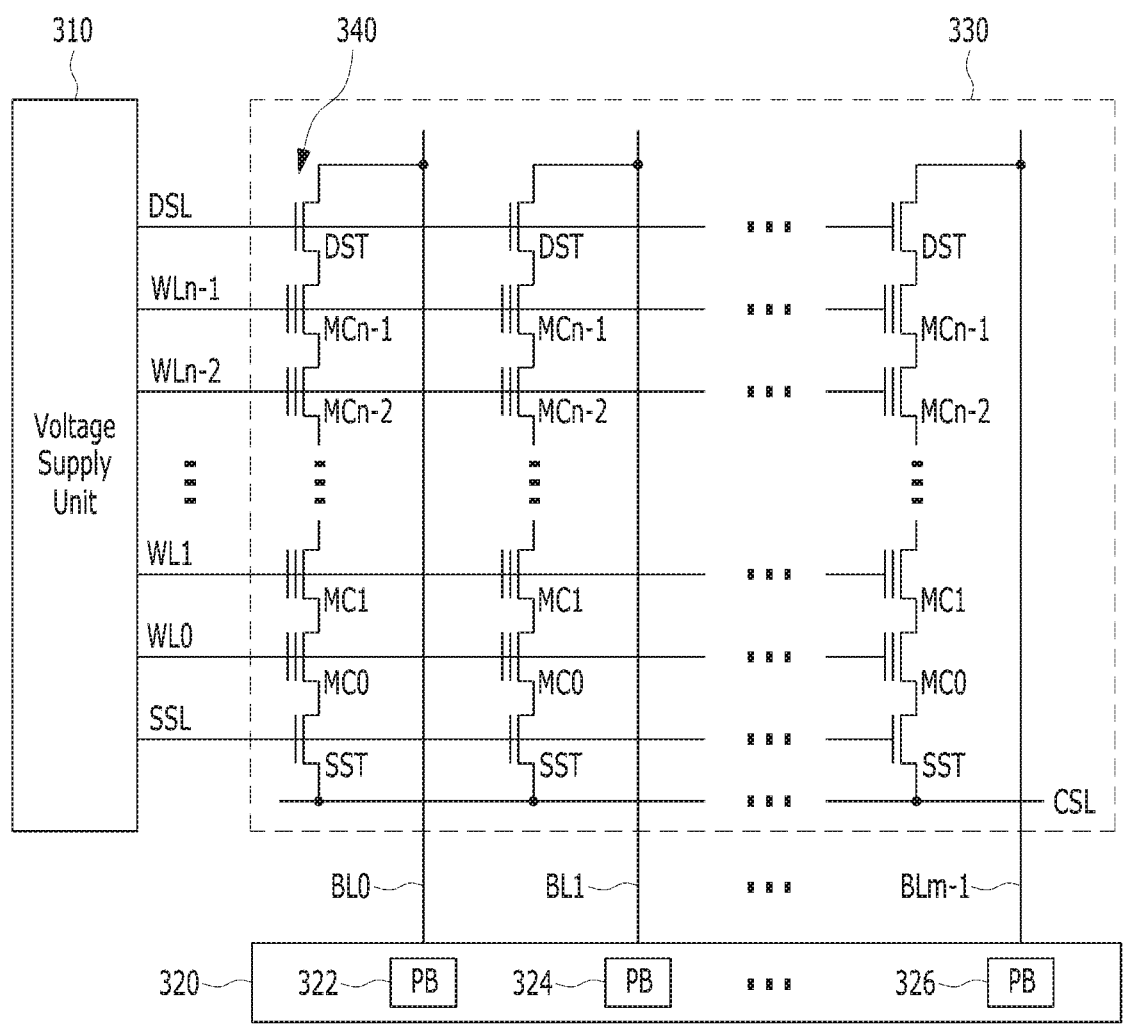
FIG. 2 is a diagram schematically illustrating an example of a memory device in the memory system in accordance with an embodiment.

FIG. 2 is a schematic diagram illustrating the memory device 150.

The memory device 150 may include a plurality of memory blocks BLOCK0 to BLOCKN−1, e.g., BLOCK0 (210), BLOCK1 (220), BLOCK2 (230), and to BLOCKN−1 (240). Each of the memory blocks 210, 220, 230 and 240 may include a plurality of pages, for example $2^M$ pages, the number of which may vary according to circuit design. For example in some applications, each of the memory blocks may include M pages. Each of the pages may include a plurality of memory cells that are coupled to a word line WL.

The memory device 150 may include not only the MLC memory blocks, each of which includes a plurality of pages that are realized by memory cells capable of storing two-bit data in one memory cell, but also triple level cell (TLC) memory blocks each of which includes a plurality of pages that are realized by memory cells capable of storing three-bit data in one memory cell, quadruple level cell (QLC) memory blocks each of which includes a plurality of pages that are realized by memory cells capable of storing four-bit data in one memory cell, and/or multiple level cell memory blocks each of which includes a plurality of pages that are realized by memory cells capable of storing five or more-bit data in one memory cell, and so forth.

In accordance with an embodiment of the present invention, the memory device 150 is described as a non-volatile memory, such as a flash memory, e.g., a NAND flash memory. However, the memory device 150 may be realized as any of a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM).

A memory block 330, which may correspond to any of the plurality of memory blocks 152 to 156 included in the memory device 150 of the memory system 110, may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells or memory cell transistors MC0 to MCn−1 may be coupled in series. In an embodiment, each of the memory cells MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 2, the first cell string is coupled to the first bit line BL0, and the last cell string is coupled to the last bit line BLm−1. For reference, in FIG. 2, 'DSL' denotes a drain select line, 'SSL' denotes a source select line, and 'CSL' denotes a common source line.

Although FIG. 2 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

The memory device 150 may be embodied by a two-dimensional (2D) or three-dimensional (3D) memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLOCK0 to BLOCKN−1.

Each memory block 330 included in the memory device 150 may include a plurality of NAND strings NS that are extended in the second direction, and a plurality of NAND strings NS (not shown) that are extended in the first direction and the third direction. Each of the NAND strings NS may be coupled to a bit line BL, at least one drain selection line DSL, at least one source selection line SSL, a plurality of word lines WL, at least one dummy word line DWL (not shown), and a common source line CSL, and each of the NAND strings NS may include a plurality of transistor structures.

In short, each memory block 330 of the memory device 150 may be coupled to a plurality of bit lines BL, a plurality of drain selection lines DSL, a plurality of source selection lines SSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a drain selection transistor DST of each NAND string NS may be coupled to a corresponding bit line BL, and a source selection transistor SST of each NAND string NS may be coupled to a common source line CSL. Memory cells MC may be provided between the drain selection transistor DST and the source selection transistor SST of each NAND string NS. In other words, a plurality of memory cells may be realized in each memory block 330 of the memory device 150.

Figure 3A:
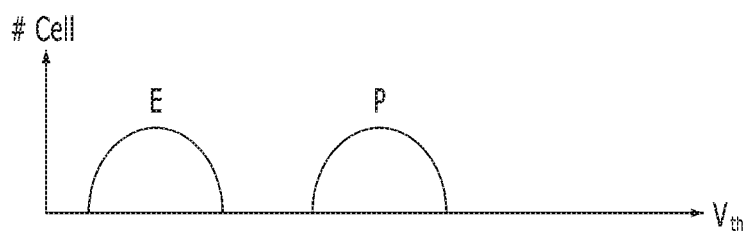
FIGS. 3A to 3C is a graph illustrating distributions of memory cells in the memory device.
Figure 3B:
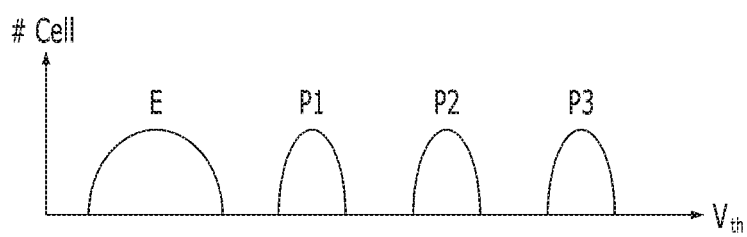
Figure 3C:
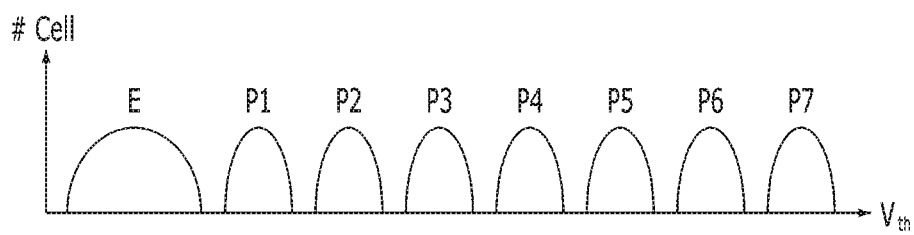

FIGS. 3A to 3C illustrates distributions of memory cells in the memory device 150.

Each of the memory cells of the memory device 150 having the structure illustrated in FIG. 2 may have a threshold voltage Vth included in any one distribution among the distributions of FIGS. 3A to 3C, according to the number of bits in program data programmed in the memory cell.

FIG. 3A illustrates cell distributions of single level cells (SLC) of which each is programmed as one bit, FIG. 3B illustrates cell distributions of multi-level cells (MLC) of which each is programmed as two bits, and FIG. 3C illustrates cell distributions of triple level cells (TLC) of which each is programmed as three bits.

In the case of the SLC, each of the memory cells of the memory cell array may have a threshold voltage included in one of an erase state E and a program state P as illustrated in FIG. 3A, according to the value of data programmed in the memory cell. In the case of the MLC, each of the memory cells of the memory cell array may have a threshold voltage included in one of an erase state E and first to third program states P1 to P3 as illustrated in FIG. 3B. In the case of the TLC, each of the memory cells of the memory cell array may have a threshold voltage included in one of an erase state E and first to seventh program states P1 to P7 as illustrated in FIG. 3C.

However, the present embodiment is not limited thereto. Although not illustrated in FIGS. 3A to 3C, each of the memory cells of the memory cell array may be programmed as four or more bits. The memory device 150 of FIG. 1 may include memory cells which are programmed as different numbers of bits.

In the case of the memory device 150, a charge loss may occur as time elapses. The charge loss may indicate that electrons trapped in a floating gate or tunnel oxide are emitted. Furthermore, as program and erase operations are repeated, the tunnel oxide may deteriorate to further increase the charge loss. The charge loss may reduce the threshold voltages.

Furthermore, program disturbance, erase disturbance and/or back pattern dependency may increase threshold voltage distributions. Therefore, when the characteristics of the memory cells in the memory device 150 deteriorate due to the above-described reason, the threshold voltage distributions of the states illustrated in FIGS. 3A to 3C may overlap each other.

FIGS. 4A-A to 4B-B are diagrams for describing states of memory cells, which are shifted by degradation in characteristics of memory cells. In particular, FIGS. 4A-A to 4B-B describe the states of the memory cells, which are shifted by temperature. FIGS. 4A-A to 4B-B illustrate only first and second memory cell states S1 and S2, for example. Only the second memory cell state S2 may be used to describe the characteristic degradation.

Referring to FIG. 4A-A, the mobility of electrons trapped in a floating gate or tunnel oxide may decrease when the outside temperature of an electronic device including the memory system 110 in accordance with the present embodiment falls. The decrease in the electron mobility may reduce the amount of current applied to a memory cell. The reduction in amount of current applied to the memory cell may increase the threshold voltage of the memory cell. As a result, the threshold voltage may increase as indicated by the second memory cell state S2 illustrated in FIG. 4A-A.

Referring to FIG. 4A-B, the mobility of electrons trapped in the floating gate or tunnel oxide in the memory device 150 may increase when the outside temperature of the electronic device including the memory system 110 in accordance with the present embodiment rises. The increase in the electron mobility may raise the amount of current applied to the memory cell, such that the electrons are rapidly emitted from the floating gate or tunnel oxide. When the electrons are emitted, a charge loss may occur. As a result, the threshold voltage may decrease as indicated by the second memory cell state S2 illustrated in FIG. 4A-B.

The threshold voltage of the memory cell may increase or decrease differently depending on temperature. That is, as the outside temperature rises, the threshold voltage of the memory cell may further decrease. On the contrary, as the outside temperature falls, the threshold voltage of the memory cell may further increase.

For example, suppose that the memory cell has the first memory cell state S1 and the second memory cell state S2, when the outside temperature is 10°.

FIG. 4B-A illustrates a threshold voltage distribution of a second memory cell state S2', which is formed with the decrease in the threshold voltage when the outside temperature is 20°. FIG. 4B-B illustrates a threshold voltage distribution of a second memory cell state S2", which is formed with the decrease in the threshold voltage when the outside temperature is 30°.

Referring to FIGS. 4B-A and 4B-B, the threshold voltage of the memory cell, formed at an outside temperature of 30°, may decrease by 'Vd' from the threshold voltage of the memory cell, formed at an outside temperature of 20°.

Only the second memory cell state S2 has been described with reference to FIGS. 4A-A to 4B-B. In the first memory cell state S1, however, the threshold voltage may increase or decrease according to the same principle.

When the threshold voltage distribution is shifted, data read from the memory device 150 may contain many fail bits.

FIGS. 4C-A and 4C-B illustrates a change in the read voltage applied to the memory device by reflecting the shifted threshold voltage distribution.

Referring to FIG. 4C-A, the processor 134 within the controller 130 may apply a default read voltage RV0 to the memory device 150 in order to read data according to a read command of the host 102. The default read voltage RV0 may indicate a preset initial read voltage. The default read voltage RV0 may be set by a designer, and changed afterwards.

However, when the outside temperature rises to decrease the threshold voltage of the second memory cell state S2 as illustrated in FIG. 4C-B, read data may contain many fall bits in the case that the processor 134 reads data by utilizing the default read voltage RV0. As described with reference to FIG. 1, the ECC 136 may provide a read retry request to the processor 134 when the number of fail bits is greater than or equal to a preset threshold value. The processor 134 may reset the read voltage in order to perform a read retry operation in response to the read retry request. In particular, the processor 134 in accordance with an embodiment may efficiently reset the read voltage by reflecting the outside temperature, during the read retry operation.

Hereafter, the read retry operation in accordance with an embodiment will be described with reference to FIGS. 5A to 7.

FIG. 5A illustrates the temperature table 510 in accordance with an embodiment, and FIG. 5B illustrates the read voltage table 530 in accordance with an embodiment. The temperature table 510 and the read voltage table 530 may be utilized during the read retry operation.

Referring to FIG. 5A, the temperature table 510 may include fields of individual countries. The temperature table 510 may have an entry indicating monthly average temperature values of the respective countries. For example, referring to the temperature table 510, the average temperature of March in a first country is '5°'. The temperature table 510 may indicate the average temperature of each month in each of the first to Kth countries. Here, 'K' in the temperature table 510 may be set by a designer.

According to RTC information and country information which are provided from the host 102, the processor 134 may check a target temperature T indicating the average temperature of the corresponding month in the corresponding country by utilizing the temperature table 510. For example, when the electronic device including the host 102 and the memory system 110 performed a system booting operation in the first country at 16:20 on Dec. 24, 2018, the processor 134 may check that the target temperature T is '0.5', based on the temperature table 510.

Referring to FIG. 5B, the read voltage table 530 may include fields of a temperature range, an index, a first read voltage RV, a second read voltage RV2 and a third read voltage RV3.

The temperature range field of the read voltage table 530 may indicate a plurality of temperature ranges. The temperature range field of the read voltage table 530 illustrated in FIG. 5B may include entries which are distinguished from one another with the same temperature difference. However, this is only an example, and the present embodiment is not limited thereto. The temperature difference may be set by a designer.

The index field of the read voltage table 530 may have a value ranging from 1 to N for each entry of the temperature range field. The index may indicate the order in which read voltages are set in the read retry operation. The processor 134 may sequentially set the read voltages from read voltages corresponding to the first index to read voltages corresponding to the $N^{th}$ index. Here, 'N' may be set by a designer. Furthermore, the processor 134 may change the set order of the read voltages by reflecting the target temperature T.

The fields of first to third read voltages RV1 to RV3 of the read voltage table 530 may indicate read voltages which are different from the default read voltage and different from one another. A set of the first to third read voltages RV1 to RV3 corresponding to an individual index may represent a set of read voltages for an individual read retry operation on a memory cell capable of storing a value of 2 or greater bits. The read voltage table 530 illustrated in FIG. 5B is a table for a read retry operation on an MLC capable of storing a value of 2 bits. Since a read operation for the MLC requires three different read voltages, the read voltage table 530 illustrated in FIG. 5B may include the fields for the first to third read voltages RV1 to RV3. A table for a read retry operation for the SLC may have a field for only one read voltage. A table for a read retry operation for the TLC may have fields of seven read voltages.

The processor 134 may set a read voltage by utilizing the read voltage table 530 during the read retry operation. For example, when the target temperature T is '15°', the processor 134 may check a target temperature range (10°≤T<20°), to which the target temperature '15°' belongs, in the read voltage table 530. The processor 134 may set, for the read retry operation, plural sets of read voltages RV1 to RV3 corresponding to plural indexes corresponding to the target temperature range.

The processor 134 may determine an order among the plural sets of read voltages RV1 to RV3 corresponding to plural indexes corresponding to the target temperature range based on the target temperature T. For example, suppose that the processor 134 preferentially sets the read voltages included in the first index when the target temperature T is '10°', which is the minimum value within the target temperature range (10°≤T<20°). In this case, when the target temperature T is '15°', which is the median value within the target temperature range (10°≤T<20°), the processor 134 may preferentially set the read voltages included in the $(N/2)^{th}$ index. The processor 134 may set, for the read retry operation, plural sets of read voltages RV1 to RV3 corresponding to plural indexes corresponding to the target temperature range according to the determined set order starting from the set of read voltages RV1 to RV3 corresponding to the $(N/2)^{th}$ index based on the target temperature, thereby performing an efficient read retry operation.

FIG. 6 is a flowchart illustrating a read operation in accordance with an embodiment.

In step S601, the host 102 may provide a read command to the controller 130. The host 102 may provide a logical address corresponding to read data to the controller 130 with the read command. The read data may indicate data to be read.

In step S603, the processor 134 within the controller 130 may check a physical address corresponding to the logical address provided from the host 102.

In step S605, the processor 134 may set a default read voltage in order to read data stored at the physical address.

In step S607, the processor 134 may provide a read request to the memory device 150. The processor 134 may provide the default read voltage and the physical address to the memory device 150 with the read request. Specifically, the processor 134 may control the memory device 150 to perform a read operation by applying the default read voltage to a target memory cell in which data corresponding to a read command is stored.

In step S609, the memory device 150 may read data based on the default read voltage and the physical address which are provided from the processor 134.

In step S611, the memory device 150 may provide the read data to the controller 130.

In step S613, the ECC 136 within the controller 130 may perform a decoding operation on the read data provided from the memory device 150 under control of the processor 134. The ECC 136 may count the number of fail bits in the read data through the decoding operation.

In step S615, the ECC 136 may compare the counted number of fails bits in the read data to a preset threshold value.

When the number of fails bits is less than the preset threshold value ('No' in step S615), the controller 130 may provide the read data to the host 102 in response to a read command in step S617.

On the other hand, when the number of fail bits is greater than or equal to the preset threshold value ('Yes' in step S615), the ECC 136 may provide a read retry request to the processor 134, and the processor 134 may perform a read retry operation in response to the read retry request, in step S619.

Figure 7:
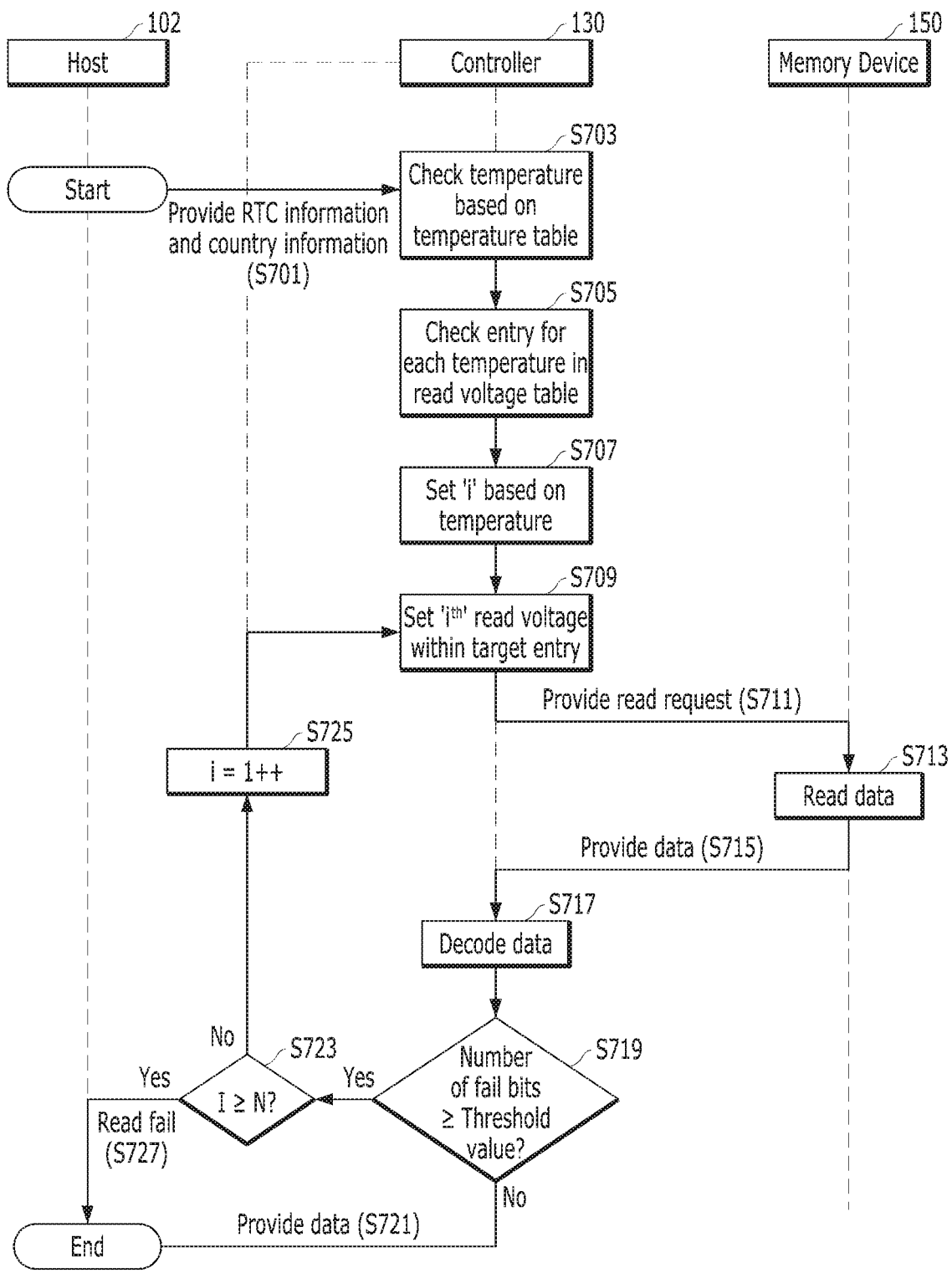
FIG. 7 is a flowchart illustrating a read retry operation in accordance with an embodiment.
Figure 8:
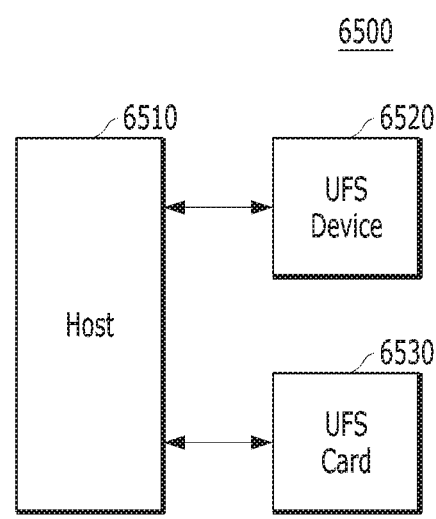
FIGS. 8 to 11 are diagrams schematically illustrating examples of a data processing system including a memory system in accordance with an embodiment.
Figure 9:
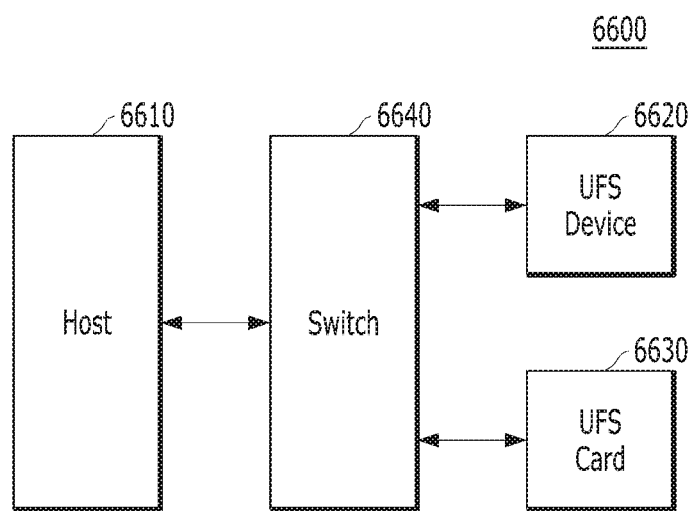
Figure 10:
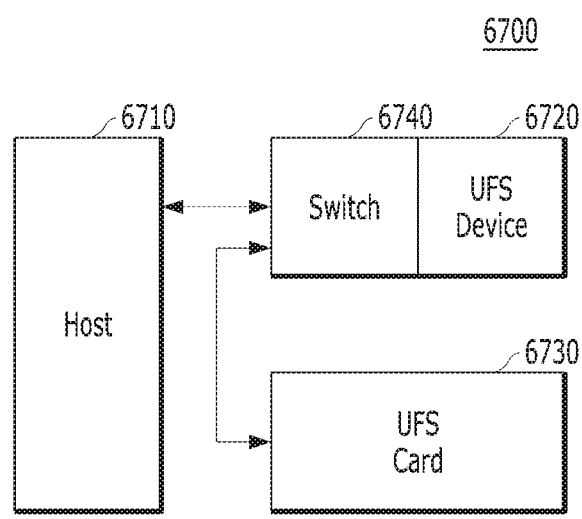
Figure 11:
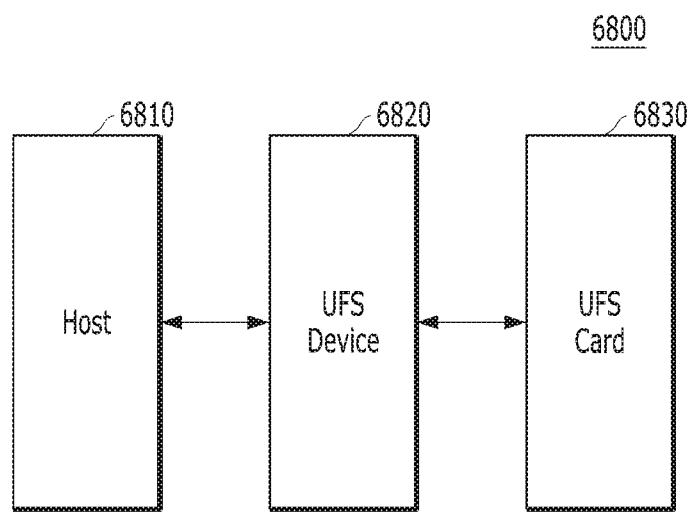

FIG. 7 is a flowchart illustrating a read retry operation in accordance with an embodiment. Steps S701 to S727 illustrated in FIG. 7 may be included in step S619 illustrated in FIG. 6.

In step S701, the host 102 may provide RTC information and country information to the controller 130. Although it is described that the operation of providing the RTC information and the country information to the controller 130 is performed in step S701, the host 102 may provide the RTC information and the country information to the controller 130 in a preset period as described with reference to FIG. 1.

In step S703, the processor 134 within the controller 130 may check the average outside temperature of the electronic device including the data processing system 100, i.e. a target temperature, by utilizing the temperature table 510 according to the RTC information and the country information which are provided from the host 102.

In step S705, the processor 134 may check a target temperature range, to which the target temperature belongs, among the plurality of temperature ranges included in the read voltage table 530.

In step S707, the processor 134 may select, based on the target temperature, a target index (e.g., the $(N/2)^{th}$ index) among the plurality of indexes corresponding to the target temperature range and setting an order value 'i' to the target index within the read voltage table 530.

In step S709, the processor 134 may set a set of read voltages RV1 to RV3 corresponding to the target index of the '$i^{th}$' order within the target temperature range.

In step S711, the processor 134 may provide the memory device 150 with a read request for reading data corresponding to the read command by utilizing the set of read voltages RV1 to RV3. Specifically, the processor 134 may control the memory device 150 to perform a read operation by applying the set read voltages RV1 to RV3 to a target memory cell in which the data corresponding to the read command is stored.

In step S713, the memory device 150 may read the data by utilizing the read voltage set in step S709.

In step S715, the memory device 150 may provide the read data to the controller 130 in response to the read request.

In step S717, the ECC 136 within the controller 130 may perform a decoding operation on the read data under control of the processor 134.

In step S719, the ECC 136 may compare the number of fail bits in the read data to a preset threshold value.

When the number of fail bits in the read data is less than the preset threshold value ('No' in step S719), the controller 130 may provide the read data to the host 102 in response to a read command in step S721.

On the other hand, when the number of fail bits in the read data is greater than or equal to the preset threshold value ('Yes' in step S719), the ECC 136 may provide a read retry request to the processor 134, and the processor 134 may compare the current order index 'i' to 'N in response to the read retry request in step S723. Here, 'N' represents the number of sets of read voltages RV1 to RV3 corresponding to the target temperature range within the read voltage table 530.

When the current order index 'i' is less than 'N' ('No' in step S723), the processor 134 may increase the order index 'i' by '1' in step S725. The controller 130 and the memory device 150 may perform steps S709 to S719 again.

On the other hand, when current order index 'i' is greater than or equal to 'N' ('Yes' in step S723), the controller 130 may report a read fail to the host 102 in response to a read command in step S727.

As described above, the memory system 110 in accordance with an embodiment may perform an efficient read retry operation by utilizing the RTC information and the country information which are provided from the host 102.

FIGS. 8 to 11 schematically illustrate examples of a data processing system including a memory system in accordance with an embodiment. FIGS. 8 to 11 schematically illustrate a universal flash storage (UFS) to which the memory system in accordance with the present embodiment is applied.

Referring to FIGS. 8 to 11, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired and/or wireless electronic devices, particularly mobile electronic devices, the UFS devices 6520, 6620, 6720 and 6820 may serve as embedded UFS devices. The UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices, particularly mobile electronic devices through UFS protocols. The UFS devices 6520, 6620, 6720 and 6820 and the UFS cards 6530, 6630, 6730 and 6830 may be embodied by the memory system 110 illustrated in FIG. 1.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, universal storage bus (USB) Flash Drives (UFDs), multi-media card (MMC), secure digital (SD), mini-SD, and micro-SD.

In accordance with the present embodiment, the data processing system can efficiently perform a read retry operation depending on temperature.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
  a memory device comprising a plurality of memory cells; and
  a controller suitable for controlling the memory device to perform a first read operation by applying a first read voltage to a target memory cell in which data corresponding to a read command provided from a host is stored,
  wherein when the number of fail bits in first read data read through the first read operation is greater than or equal to a set threshold value, the controller is further suitable for:
  checking outside temperature, which is previously recorded in a temperature table, based on real time clock (RTC) information and country information which are provided from the host, wherein the country information indicates where the memory system including the host is currently used,
  setting a second read voltage based on the outside temperature and a read voltage table, and
  controlling the memory device to perform a second read operation by applying the second read voltage to the target memory cell.

2. The memory system of claim 1,
  wherein the temperature table indicates monthly average temperature for each of plural pieces of country information,
  wherein the read voltage table indicates a plurality of temperature ranges, a plurality of indexes corresponding to each of the temperature ranges, and plural read voltages corresponding to each of the indexes.

3. The memory system of claim 1, wherein the controller comprises:
  a memory suitable for storing the temperature table and the read voltage table;
  an error correction code unit (ECC) suitable for counting the number of fail bits through a decoding operation on the first read data, and comparing the number of fail bits to a set threshold value; and
  a processor suitable for performing the checking, the setting, and the controlling when the number of fail bits in the first read data is greater than or equal to the set threshold value.

4. The memory system of claim 2, wherein the controller checks a target temperature range including the outside temperature among the plurality of temperature ranges included in the read voltage table.

5. The memory system of claim 4, wherein the controller selects a target index among the plurality of indexes included in the target temperature range based on the outside temperature.

6. The memory system of claim 5, wherein the controller sets a voltage included in the target index to the second read voltage.

7. The memory system of claim 6, wherein the controller performs a decoding operation on second read data read through the second read operation, and checks whether the target index is the last index corresponding to the target temperature range, when the number of fail bits in the second read data is greater than or equal to a set threshold value.

8. The memory system of claim 7, wherein when the target index is not the last index corresponding to the target temperature range, the controller sets a voltage, which is included in a next index of the target index and corresponding to the target temperature range, to a third read voltage, and controls the memory device to perform a third read operation by applying the third read voltage to the target memory cell.

9. The memory system of claim 7, wherein when the target index is the last index corresponding to the target temperature range, the controller reports a read fail for the data to the host.

10. The memory system of claim 7, wherein when the number of fail bits in the second read data is less than the set threshold value, the controller provides the second data to the host in response to the read command.

11. An operating method of a memory system, the operating method comprising:

receiving real time clock (RTC) information and country information from a host, wherein the country information indicates where the memory system is currently used;

performing a first read operation by applying a first read voltage to a target memory cell in which data corresponding to a read command provided from the host is stored;

checking outside temperature, which is previously recorded in a temperature table, based on the RTC information and the country information when the number of fail bits in first read data read through the first read operation is greater than or equal to a set threshold value;

setting a second read voltage based on the outside temperature and a read voltage table; and performing a second read operation by applying the second read voltage to the target memory cell.

12. The operating method of claim 11,
wherein the temperature table indicates monthly average temperature of each of plural pieces of country information,
wherein the read voltage table indicates a plurality of temperature ranges, a plurality of indexes corresponding to each of the temperature ranges, and plural read voltages corresponding to each of the indexes.

13. The operating method of claim 11, further comprising:
storing the temperature table and the read voltage table;
counting the number of fail bits in the first read data by performing a decoding operation on the first read data; and
comparing the number of fail bits in the first read data to a set threshold value.

14. The operating method of claim 12, wherein the setting comprises checking a target temperature range including the outside temperature among the plurality of temperature ranges included in the read voltage table.

15. The operating method of claim 14, further comprising selecting a target index among the plurality of indexes included in the target temperature range based on the outside temperature.

16. The operating method of claim 15, wherein the setting includes setting a voltage included in the target index to the second read voltage.

17. The operating method of claim 16, further comprising:
performing a decoding operation on second read data read through the second read operation; and
checking whether the target index is the last index corresponding to the target temperature range, when the number of fail bits in the second read data is greater than or equal to a set threshold value.

18. The operating method of claim 17, further comprising:
setting a voltage, which is included in a next index of the target index and corresponding to the target temperature range, to a third read voltage, when the target index is not the last index corresponding to the target temperature range; and
performing a third read operation by applying the third read voltage to the target memory cell.

19. The operating method of claim 17, further comprising providing the second read data to the host, when the number of fail bits in the second read data is less than the set threshold value.

20. A memory system comprising:
a memory device including memory cells; and
a controller configured to:
store therein a temperature table and a read-retry voltage table;
obtain temperature information of a current temperature at a current geographical location based on the temperature table, which is previously recorded, and information of a real time clock (RTC) and a current geographical location provided from a host, wherein the current geographical location indicates where the memory system is currently used;
control the memory device to perform a read-retry operation on one or more of the memory cells according to a group of read voltages selected on a basis of the temperature information and the read-retry voltage table,
wherein the temperature table has information of monthly average temperatures at specific geographical locations, and
wherein the read-retry voltage table has information of plural groups of read voltages for each of predetermined temperature ranges.

* * * * *